United States Patent
Deivasigamani et al.

(10) Patent No.: US 10,475,885 B2
(45) Date of Patent: Nov. 12, 2019

(54) SEMICONDUCTOR SUBSTRATE STRUCTURES AND SEMICONDUCTOR DEVICES

(71) Applicant: Nuvoton Technology Corporation, Hsinchu (TW)

(72) Inventors: Ravi Deivasigamani, Tamil Nadu (IN); Po-An Chen, Toufen (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 15/859,932

(22) Filed: Jan. 2, 2018

(65) Prior Publication Data

US 2019/0088744 A1    Mar. 21, 2019

(30) Foreign Application Priority Data

Sep. 21, 2017   (TW) .............................. 106132415 A

(51) Int. Cl.
| | |
|---|---|
| *H01L 29/10* | (2006.01) |
| *H01L 29/78* | (2006.01) |
| *H01L 29/06* | (2006.01) |
| *H01L 21/74* | (2006.01) |
| *H01L 29/66* | (2006.01) |

(52) U.S. Cl.
CPC .......... *H01L 29/1083* (2013.01); *H01L 21/74* (2013.01); *H01L 29/0649* (2013.01); *H01L 29/66681* (2013.01); *H01L 29/7816* (2013.01)

(58) Field of Classification Search
CPC ........... H01L 29/1083; H01L 29/66681; H01L 29/7816; H01L 29/0684
See application file for complete search history.

(56) References Cited

U.S. PATENT DOCUMENTS

| 6,664,608 B1 | 12/2003 | Burr |
| 8,304,856 B2 | 11/2012 | Mita et al. |
| 10,177,252 B2 * | 1/2019 | Lin ..................... H01L 29/7816 |
| 10,217,740 B2 * | 2/2019 | Cho ....................... H01L 27/088 |
| 10,256,340 B2 * | 4/2019 | Chin ................... H01L 29/7816 |

(Continued)

OTHER PUBLICATIONS

Office Action dated Feb. 27, 2018 in TW Application No. 106132415 (3 pages).

*Primary Examiner* — Victoria K. Hall
(74) *Attorney, Agent, or Firm* — Muncy, Geissler, Olds & Lowe, P.C.

(57) ABSTRACT

A semiconductor substrate structure includes a semiconductor substrate (P-type), a first buried well region (N-type) disposed in the semiconductor substrate, a first buried layer (N-type) and a second buried layer (P-type) disposed in the semiconductor substrate and on the first buried well region. The first buried layer has a first portion and a second portion. The second buried layer is located between the first portion and the second portion. A top surface of the first portion, a top surface of the second buried layer, and a top surface of the second portion are level with a top surface of the semiconductor substrate, a sidewall of the first portion is aligned with a sidewall of the first buried well region, and a sidewall of the second portion is aligned with another sidewall of the first buried well region. A semiconductor device includes the semiconductor substrate structure and an epitaxial layer.

16 Claims, 12 Drawing Sheets

(56) References Cited

U.S. PATENT DOCUMENTS

| | | | |
|---|---|---|---|
| 10,262,990 B2* | 4/2019 | Lee | H01L 27/0255 |
| 10,325,867 B2* | 6/2019 | Cho | H01L 21/823493 |
| 2002/0053695 A1* | 5/2002 | Liaw | H01L 29/1083 |
| | | | 257/328 |
| 2004/0026717 A1 | 2/2004 | Okawa et al. | |
| 2008/0061376 A1 | 3/2008 | Williams et al. | |
| 2009/0146258 A1* | 6/2009 | Zhang | H01L 21/82285 |
| | | | 257/592 |
| 2014/0061858 A1* | 3/2014 | Lin | H01L 29/73 |
| | | | 257/565 |
| 2014/0231908 A1* | 8/2014 | Chen | H01L 29/66681 |
| | | | 257/336 |
| 2014/0239450 A1 | 8/2014 | Horng et al. | |
| 2016/0099310 A1* | 4/2016 | Tsuchiko | H01L 21/8222 |
| | | | 257/501 |
| 2016/0336442 A1* | 11/2016 | Nielsen | H01L 21/823892 |
| 2017/0207305 A1* | 7/2017 | Yen | H01L 29/0865 |
| 2019/0013397 A1* | 1/2019 | Singh | H01L 29/7371 |
| 2019/0019472 A1* | 1/2019 | Chin | G09G 3/3688 |
| 2019/0103471 A1* | 4/2019 | Aghoram | H01L 29/42336 |
| 2019/0198608 A1* | 6/2019 | Kim | H01L 29/0626 |

* cited by examiner

SEMICONDUCTOR SUBSTRATE STRUCTURES AND SEMICONDUCTOR DEVICES

CROSS REFERENCE TO RELATED APPLICATIONS

This Application claims priority of Taiwan Patent Application No. 106132415, filed on Sep. 21, 2017, the entirety of which is incorporated by reference herein.

BACKGROUND OF THE INVENTION

Field of the Invention

The invention relates to semiconductor substrate structures and semiconductor devices, and in particular to semiconductor substrate structures having buried layers and buried well regions with opposite conductivity types.

Description of the Related Art

The semiconductor integrated circuit (IC) industry has developed rapidly over the past few decades. As semiconductor devices continue to be produced at smaller sizes, following Moore's law, the operation speed and the processing technique of the devices are continuously being improved. However, as the size of these devices becomes smaller, the problem of leakage current produced when voltage is applied becomes more and more non-negligible. To shrink the size of the elements and reduce the cost of processing at the same time, the semiconductor integrated circuit industry has constantly improved in terms of the design of materials and manufacturing processes.

Although existing semiconductor devices and methods for forming the same have been adequate for their intended purposes, they have not been entirely satisfactory in all respects. Therefore, there are still some problems to be overcome in regards to semiconductor integrated circuits and technology.

BRIEF SUMMARY OF THE INVENTION

Embodiments of semiconductor devices and methods for forming the same are provided in this disclosure, especially the embodiments of diodes, such as bootstrap diodes. Generally, when a forward bias voltage is applied to a diode, a leakage current flowing into the semiconductor substrate may be produced easily because the dopant concentration of the portion of the parasitic PNP transistor in the base area of the semiconductor device is too low. By disposing heavily doped buried layers and buried well regions, which have opposite conductivity types and wider ranges, in the semiconductor substrate, multiple PN junctions (such as PNPNP) may exist between the epitaxial layer on the semiconductor substrate and the semiconductor substrate. Therefore, leakage current can be prevented from flowing into the semiconductor substrate in the vertical direction.

In addition, multiple well regions are disposed in the epitaxial layer, and these well regions are arranged in such a way that they are staggered in the horizontal direction according to their conductivity types, such that multiple PN junctions (such as PNPNP) can be produced. As a result, leakage current can be prevented from occurring in the horizontal direction.

Some embodiments of the disclosure provide a semiconductor substrate structure. The semiconductor substrate structure includes a semiconductor substrate having a first conductivity type, and a first buried well region disposed in the semiconductor substrate, wherein the first buried well region has a second conductivity type that is opposite to the first conductivity type. The semiconductor substrate structure also includes a first buried layer and a second buried layer disposed in the semiconductor substrate and on the first buried well region, wherein the first buried layer has the second conductivity type, the second buried layer has the first conductivity type, the first buried layer has a first portion and a second portion, and the second buried layer is located between the first portion and the second portion.

Some embodiments of the disclosure provide a semiconductor device. The semiconductor device includes a semiconductor substrate having a first conductivity type, and a first buried well region disposed in the semiconductor substrate, wherein the first buried well region has a second conductivity type that is opposite to the first conductivity type. The semiconductor device also includes a first buried layer and a second buried layer disposed in the semiconductor substrate and on the first buried well region, wherein the first buried layer has the second conductivity type, the second buried layer has the first conductivity type, and the first buried layer has a first portion and a second portion, the second buried layer is located between the first portion and the second portion. The semiconductor device further includes an epitaxial layer disposed on the semiconductor substrate, wherein the epitaxial layer includes a first well region, a second well region and a third well region, the first well region and the second well region have the first conductivity type, the third well region has the second conductivity type, and the second well region is located between the first well region and the third well region. In addition, the semiconductor device includes a first electrode, a second electrode and a third electrode disposed on the epitaxial layer, wherein the first electrode is electrically connected to the first well region, the second electrode is electrically connected to the second well region, and the third electrode is electrically connected to the third well region.

The semiconductor substrate structure of the present disclosure may be applied to different types of semiconductor devices. In order to make the features and the advantages of the present disclosure more apparent and easy to understand, the embodiments of diodes, such as bootstrap diodes, are provided in the following descriptions with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1B:
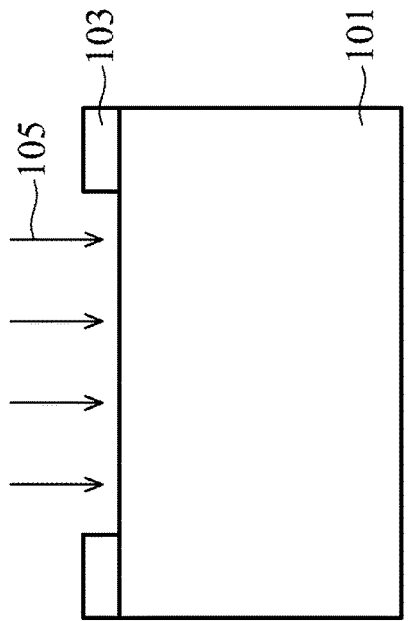
FIGS. 1A to 1D are cross-sectional views illustrating intermediate stages of a method for forming a semiconductor substrate structure in FIG. 1D in accordance with some embodiments.

The following disclosure provides many different embodiments, or examples, for implementing different components of the semiconductor devices provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various figures and illustrative embodiments, like reference numbers are used to designate like elements. It should be understood that additional operations can be provided before, during, and after the method, and some of the operations described can be replaced or eliminated for other embodiments of the method.

FIGS. 1A to 1D are cross-sectional views illustrating intermediate stages of a method for forming a semiconductor substrate structure 100 in accordance with some embodiments.

Figure 1A:
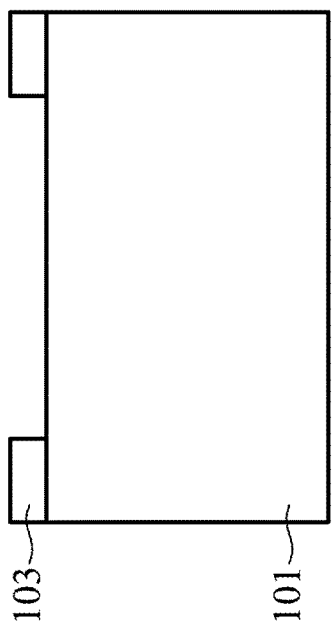

As shown in FIG. 1A, in accordance with some embodiments, a patterned photo resist 103 is formed on the semiconductor substrate 101, and a portion of the semiconductor substrate 101 is exposed by the patterned photo resist 103. The semiconductor substrate 101 may be made of silicon or other semiconductor materials. Alternatively, the semiconductor substrate 101 may include other elementary semiconductor materials such as germanium (Ge). In some embodiments, the semiconductor substrate 101 is made of a compound semiconductor such as silicon carbide (SiC), gallium nitride (GaN), gallium arsenic (GaAs), indium arsenide (InAs), or indium phosphide (InP). In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 may include a silicon-on-insulator (SOI) substrate. In some embodiments, the semiconductor substrate 101 includes an epitaxial layer. For example, the semiconductor substrate 101 has an epitaxial layer covering a bulk semiconductor. It is worth noting that the semiconductor substrate 101 may be a lightly doped p-type or n-type substrate. In the present embodiment, the semiconductor substrate 101 is p-type.

Next, as shown in FIG. 1B, an ion implantation process 105 is performed on the semiconductor substrate 101 by using the patterned photo resist 103 as the mask, and n-type dopants, such as phosphorous 31 (P31) or arsenic (As), or p-type dopants, such as boron 11 (B11), can be implanted in the semiconductor substrate 101. In the embodiment, the ion implantation process 105 is performed to implant n-type dopants in the semiconductor substrate 101, and the implantation dose is in a range from about $1\times10^{11}$ ions/cm$^2$ to about $1\times10^{13}$ ions/cm$^2$.

Figure 1D:
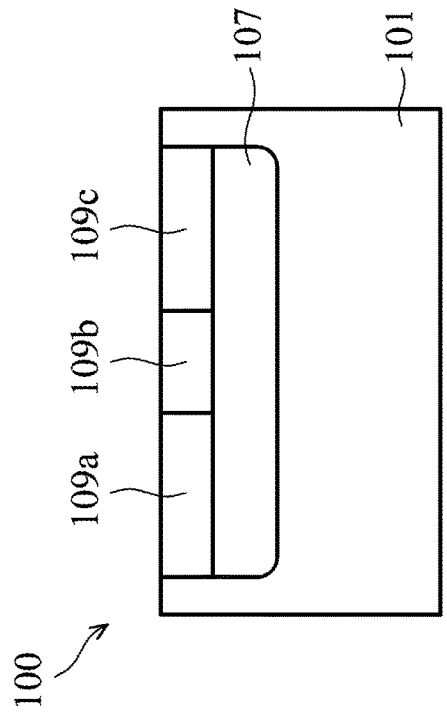
Figure 1C:
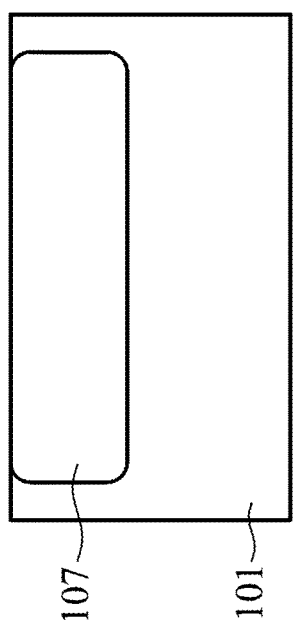

As shown in FIG. 1C, in accordance with some embodiments, the patterned photo resist 103 is removed after performing the ion implantation process 105, and the ions implanted are driven into the semiconductor substrate 101 to form a first buried well region 107. The top surface of the first buried well region 107 is level with the top surface of the semiconductor substrate 101, and the bottom surface of the first buried well region 107 is located in the semiconductor substrate 101. In some embodiments, the depth of the first buried well region 107 is about more than 5 μm, especially in a range from about 5 μm to about 7 μm. In the embodiment, the first buried well region 107 is n-type.

Then, as shown in FIG. 1D, a first portion of a first buried layer 109a, a second buried layer 109b and a second portion of the first buried layer 109c are formed in the semiconductor substrate 101 by ion implantation processes so that the semiconductor substrate structure 100 is completed. The first portion of the first buried layer 109a, the second buried layer 109b and the second portion of the first buried layer 109c are located above the remaining of the first buried well region 107, and the second buried layer 109b is located between the first portion of the first buried layer 109a and the second portion of the first buried layer 109c. Specifically, the sidewalls on both sides of the second buried layer 109b are adjacent to the first portion of the first buried layer 109a and the second portion of the first buried layer 109c, respectively.

In some embodiments, the top surface of the first portion of the first buried layer 109a, the top surface of the second buried layer 109b, and the top surface of the second portion of the first buried layer 109c are level with the top surface of the semiconductor substrate 101. Moreover, a sidewall of the first portion of the first buried layer 109a is aligned with a sidewall of the first buried well region 107, and a sidewall of the second portion of the first buried layer 109c is aligned with another sidewall of the first buried well region 107.

In the embodiment, the first portion of the first buried layer 109a and the second portion of the first buried layer 109c are n-type, and the second buried layer 109b is p-type. Moreover, the dopant concentration of the first portion of the first buried layer 109a, the dopant concentration of the second buried layer 109b and the dopant concentration of the second portion of the first buried layer 109c are higher than the dopant concentration of the first buried well region 107. In some embodiments, the dopant concentrations of the first portion and the second portion of the first buried layer 109a and 109c are in a range from about $5\times10^{17}$ atoms/cm$^3$ to about $5\times10^{19}$ atoms/cm$^3$, and the dopant concentration of the second buried layer is in a range from about $1\times10^{17}$ atoms/cm$^3$ to about $5\times10^{18}$ atoms/cm$^3$. In addition, the cross section of the semiconductor substrate structure 100 in FIG. 1D is bilaterally symmetrical about the central line of the second buried layer 109b, which is the axis of symmetry.

It is worth noting that the dopant concentrations of the first portion and the second portion of the first buried layer 109a and 109c are higher than the dopant concentration of the first buried well region 107, and the bottom surfaces of the first portion and the second portion of the first buried layer 109a and 109c are higher than the bottom surface of the first buried well region 107. Therefore, when a reversed bias voltage is applied to a semiconductor device having the semiconductor substrate structure 100, the reversed breakdown voltage of the semiconductor device can be maintained at a higher level.

In addition, by disposing the second buried layer 109b in the semiconductor substrate 101, wherein the second buried layer 109b has the same conductivity type as the semiconductor substrate 101, and by disposing the first buried well region 107 between the second buried layer 109b and the semiconductor substrate 101, wherein the first buried well region 107 has the opposite conductivity type from the second buried layer 109b and the semiconductor substrate 101, multiple PN junctions (such as PNP) may be produced, such that the current above the semiconductor substrate structure 100 can be prevented from flowing downward into the semiconductor substrate 101. As a result, the problem with leakage current can be prevented. In some embodiments, other elements may be formed on the semiconductor substrate structure 100, such as a lateral diffused metal oxide semiconductor (LDMOS) or a diode.

Figure 2:
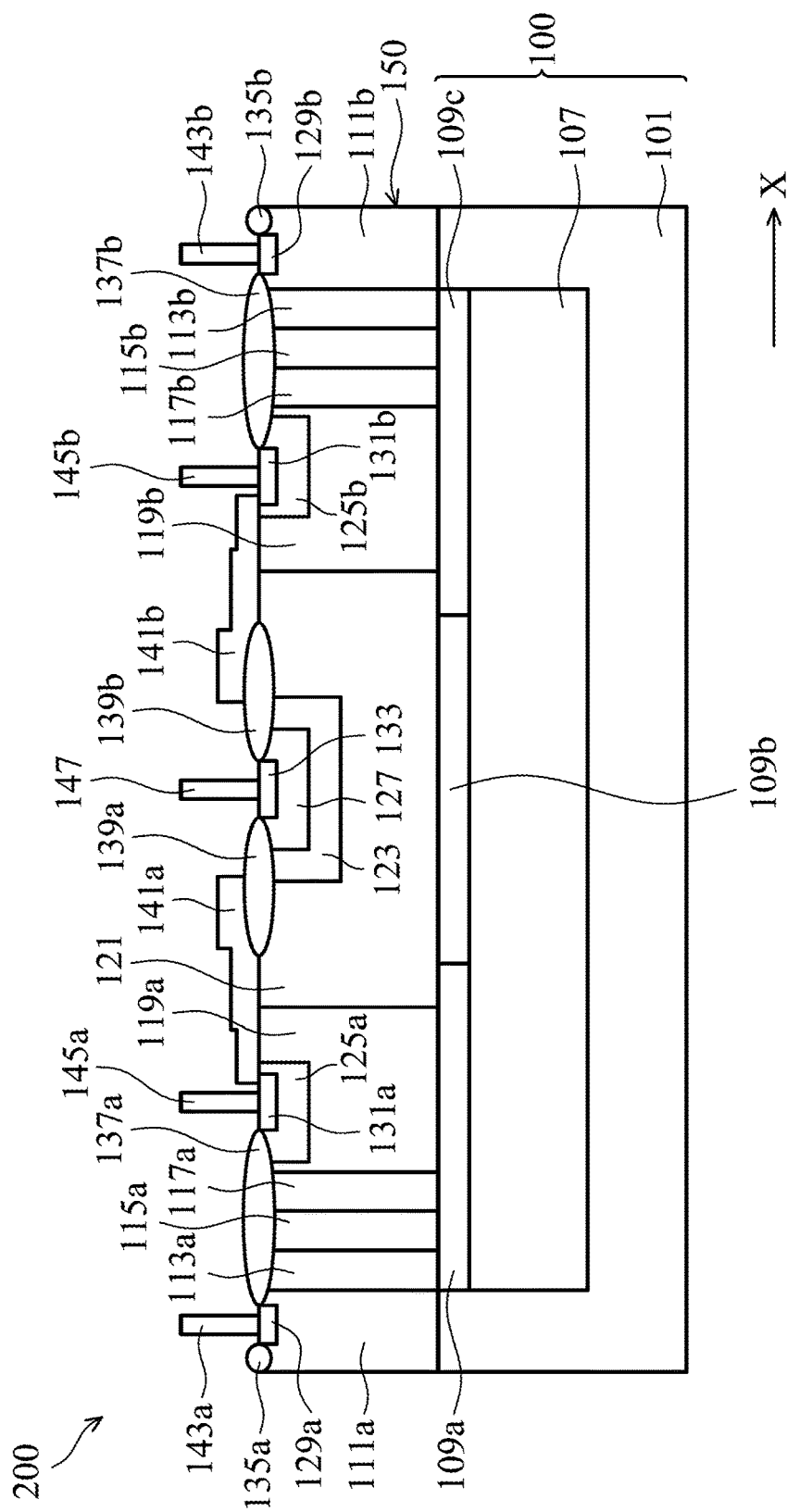
FIG. 2 is a cross-sectional view of a semiconductor device in accordance with some embodiments, wherein the semiconductor device of FIG. 2 includes the semiconductor substrate structure of FIG. 1D.

FIG. 2 is a cross-sectional view of a semiconductor device 200 in accordance with some embodiments, wherein the semiconductor device 200 of FIG. 2 includes the semiconductor substrate structure 100 of FIG. 1D.

In some embodiments, the semiconductor device 200 has an epitaxial layer 150 disposed on the semiconductor substrate structure 100, and a plurality of well regions which are adjacent to each other are disposed in the epitaxial layer 150. Specifically, a first portion of a first well region 111a, a first portion of a fourth well region 113a, a first portion of a fifth well region 115a, a first portion of a sixth well region 117a, a first portion of a second well region 119a, a third well region 121, a second portion of the second well region 119b, a second portion of the sixth well region 117b, a second portion of the fifth well region 115b, a second portion of the fourth well region 113b and a second portion of the first well region 111b are disposed in the epitaxial layer 150, and are sequentially arranged in a direction from the first portion of the first buried layer 109a to the second portion of the first buried layer 109c. That is, they are sequentially arranged along a horizontal direction X.

It is worth noting that the first portion of the first well region 111a is not directly above the first portion of the first buried layer 109a, and the second portion of the first well region 111b is not directly above the second portion of the first buried layer 109c, either. In some embodiments, the first portion and the second portion of the first buried layer 109a and 109c are not covered by the first portion and the second portion of the first well region 111a and 111b. In other words, the projection of the first portion of the first well region 111a and the projection of the first portion of the first buried layer 109a on the top surface of the semiconductor substrate 101 are non-overlapped, and the projection of the second portion of the first well region 111b and the projection of the second portion of the first buried layer 109c on the top surface of the semiconductor substrate 101 are non-overlapped.

Moreover, the third well region 121 is located directly above the second buried layer 109b and covering the first portion and the second portion of the first buried layer 109a and 109c. In some embodiments, the third well region 121 is adjacent to the first portion and the second portion of the second well region 119a and 119b, the first portion and the second portion of the first buried layer 109a and 109c, and the second buried layer 109b.

In some embodiments, the first portion of the fourth well region 113a, the first portion of the fifth well region 115a, the first portion of the sixth well region 117a, and the first portion of the second well region 119a are adjacent to the first portion of the first buried layer 109a, but are not adjacent to the second buried layer 109b. Moreover, the second portion of the second well region 119b, the second portion of the sixth well region 117b, the second portion of the fifth well region 115b, and the second portion of the fourth well region 113b are adjacent to the second portion of the first buried layer 109c, but are not adjacent to the second buried layer 109b. In other words, with respect to the projections on the top surface of the semiconductor substrate 101, the projections of the first portion of the fourth well region 113a, the first portion of the fifth well region 115a, the first portion of the sixth well region 117a, and the first portion of the second well region 119a overlap that of the first portion of the first buried layer 109a, but do not overlap that of the second buried layer 109b. Moreover, with respect to the projections on the top surface of the semiconductor substrate 101, the projections of the second well region 119b, the second portion of the sixth well region 117b, the second portion of the fifth well region 115b, and the second portion of the fourth well region 113b overlap that of the first buried layer 109c, but do not overlap that of the second buried layer 109b.

In some embodiments, the multiple well regions in the epitaxial layer 150 are arranged in such a way that they are staggered in the horizontal direction X according to their conductivity types, such that multiple PN junctions (such as PNPNP) can be produced. As a result, the problem with leakage current in the horizontal direction X can be prevented. In the embodiment, the first portion and the second portion of the first well region 111a and 111b, the first portion and the second portion of the fifth well region 115a and 115b, and the first portion and the second portion of the second well region 119a and 119b are p-type. The first portion and the second portion of the fourth well region 113a and 113b, the first portion and the second portion of the sixth well region 117a and 117b, and the third well region 121 are n-type.

Still referring to FIG. 2, the first portion of the first well region 111a has a doped region 129a therein, the second portion of the first well region 111b has a doped region 129b therein, and the doped regions 129a and 129b are p-type. The first portion of the second well region 119a has a first portion of a body region 125a therein, and the first portion of the body region 125a has a doped region 131a therein. Moreover, the second portion of the second well region 119b has a second portion of the body region 125b therein, the second portion of the body region 125b has a doped region 131b therein, and the first portion and the second portion of the body region 125a and 125b and the doped regions 131a and 131b are p-type. The third well region 121 has a drift region 123 therein, the drift region 123 has a well region 127 therein, the well region has a doped region 133 therein, and the drift region 123, the well region 127 and the doped region 133 are n-type.

In some embodiments, the following elements are sorted by their dopant concentrations. The dopant concentrations of the doped regions 129a, 129b, 131a, 131b and 133 are higher than that of the first portion and the second portion of the body region 125a and 125b, and the dopant concentrations of the first portion and the second portion of the body region 125a and 125b are higher than that of the first portion and the second portion of the second well region 119a and 119b. In addition, the dopant concentrations of the doped regions 129a, 129b, 131a, 131b and 133 are higher than that of the drift region 123, and the dopant concentration of the drift region 123 is higher than that of the third well region 121.

Furthermore, a plurality of isolation structures 135a, 135b, 137a, 137b, 139a and 139b are disposed on the epitaxial layer 150, and portions of the isolation structures 135a, 135b, 137a, 137b, 139a and 139b are embedded in the epitaxial layer 150. In some embodiments, the isolation structures 135a, 135b, 137a, 137b, 139a and 139b may be made of silicon oxide, silicon nitride or silicon oxynitride.

In some embodiments, a portion of the first portion of the first well region 111a is covered by the isolation structure 135a, and a portion of the second portion of the first well region 111b is covered by the isolation structure 135b. The first portion of the fourth well region 113a, the first portion of the fifth well region 115a and the first portion of the sixth well region 117a are covered by the isolation structure 137a, and the second portion of the fourth well region 113b, the second portion of the fifth well region 115b and the second portion of the sixth well region 117b are covered by the isolation structure 137b. A portion of the third well region 121, a portion of the drift region 123 and a portion of the well region 127 are covered by the isolation structure 139a, and another portion of the third well region 121, another portion of the drift region 123 and another portion of the well region 127 are covered by the isolation structure 139b.

The semiconductor device 200 has a first portion of a first electrode 143a, a second portion of the first electrode 143b, a first portion of a second electrode 145a, a second portion of the second electrode 145b, a third electrode 147, a first portion of the gate 141a, and a second portion of the gate 141b disposed on the epitaxial layer 150. In some embodiments, the above-mentioned electrodes and gates may be made of polysilicon or metal materials. In addition, the first portion and the second portion of the gate 141a and 141b can be disposed optionally.

In some embodiments, the first portion of the gate 141a is disposed between the first portion of the second electrode 145a and the third electrode 147, and a portion of the first portion of the second well region 119a and a portion of the third well region 121 are covered by the first portion of the gate 141a. The second portion of the gate 141b is disposed between the second portion of the second electrode 145b and the third electrode 147, and a portion of the second portion of the second well region 119b and a portion of the third well region 121 are covered by the second portion of the gate 141b.

It is worth noting that the first portion of the first electrode 143a is electrically connected to the semiconductor substrate 101 through the first portion of the first well region 111a (i.e., the first portion of the first electrode 143a can be used as a common electrode). The first portion of the second electrode 145a is electrically connected to the first portion of the second well region 119a. The third electrode 147 is electrically connected to the third well region 121. The second portion of the second electrode 145b is electrically connected to the second portion of the second well region 119b, and the second portion of the first electrode 143b is electrically connected to the semiconductor substrate 101 through the second portion of the first well region 111b (i.e., the second portion of the first electrode 143b can be used as a common electrode).

In the embodiment, the semiconductor device 200 is a diode, such as a bootstrap diode, the first portion and the second portion of the second electrode 145a and 145b are anode electrodes, and the third electrode 147 is a cathode electrode. Moreover, the cross section of the semiconductor device 200 in FIG. 2 is bilaterally symmetrical about the central line of the second buried layer 109b, the third well region 121 and the third electrode 147, which is the axis of symmetry.

In the epitaxial layer 150 of the semiconductor device 200, such as a diode, multiple well regions are disposed between the first portion of the second electrode 145a (i.e. the anode electrode) and the first portion of the first electrode 143a, and between the second portion of the second electrode 145b (i.e. the anode electrode) and the second portion of the first electrode 143b, respectively. The above-mentioned well regions are arranged in such a way that they are staggered according to their conductivity types, such that multiple PN junctions (such as PNPNP) can be produced. As a result, the leakage current flowing from the first portion of the second well region 119a to the first portion of the first well region 111a, and the leakage current flowing from the second portion of the second well region 119b to the second portion of the first well region 111b can be prevented from occurring in the horizontal direction X.

Figure 3B:
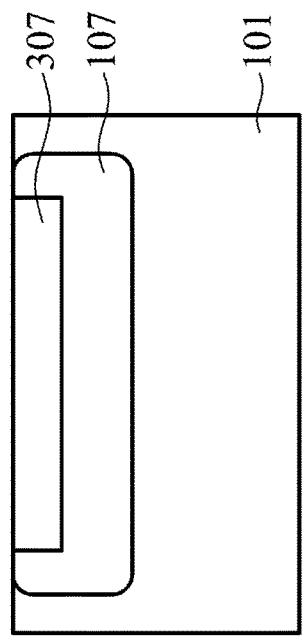
FIGS. 3A to 3C are cross-sectional views illustrating intermediate stages of a method for forming a semiconductor substrate structure in FIG. 3C in accordance with some embodiments.
Figure 3A:
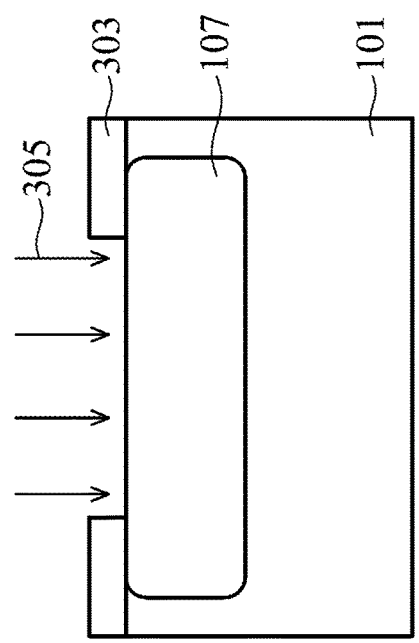
Figure 3C:
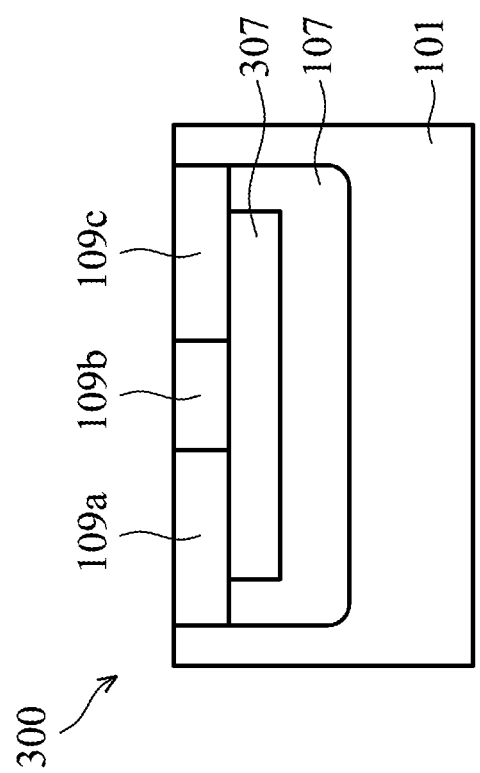

FIGS. 3A to 3C are cross-sectional views illustrating intermediate stages of a method for forming a semiconductor substrate structure 300 in FIG. 3C in accordance with some embodiments.

Continued from FIG. 1C, as shown in FIG. 3A, after the first buried well region 107 is formed, a patterned photo resist 303 is formed on the semiconductor substrate 101. A portion of the first buried well region 107 is exposed by the patterned photo resist 303, and an ion implantation process 305 is performed on the semiconductor substrate 101 by using the patterned photo resist 303 as the mask. In the embodiment, the ion implantation process 305 is performed to implant p-type dopants in the first buried well region 107, and the implantation dose is in a range from about $1 \times 10^{12}$ ions/cm$^2$ to about $5 \times 10^{13}$ ions/cm$^2$.

Next, as shown in FIG. 3B, the patterned photo resist 303 is removed after performing the ion implantation process 305, and the ions implanted are driven into the first buried well region 107 to form a second buried well region 307. The top surface of the second buried well region 307 is level with the top surface of the semiconductor substrate 101 and the top surface of the first buried well region 107, and the bottom surface of the second buried well region 307 is higher than the bottom surface of the first buried well region 107. In some embodiments, the depth of the second buried well region 307 is about more than 2 μm.

Moreover, the conductivity type of the second buried well region 307 is opposite to the conductivity type of the first buried well region 107. In the embodiment, the second buried well region 307 is p-type, and the dopant concentrations of the first portion and the second portion of the first buried layer 109a and 109c are higher than the dopant concentration of the second buried well region 307.

As shown in FIG. 3C, in accordance with some embodiments, the first portion of the first buried layer 109a, the second buried layer 109b and the second portion of the first buried layer 109c are formed in the semiconductor substrate 101 by ion implantation processes so that the semiconductor substrate structure 300 is completed. Some processes used to form the first portion of the first buried layer 109a, the second buried layer 109b and the second portion of the first buried layer 109c in FIG. 3C are similar to, or the same as, those used to form the first portion of the first buried layer 109a, the second buried layer 109b and the second portion of the first buried layer 109c in FIG. 1D, respectively, so the descriptions thereof are not repeated herein. In some embodiments, the sidewalls of the second buried well region 307 are not aligned with the sidewalls of the first buried well region 107, and are not aligned with the sidewalls of the first portion and the second portion of the first buried layer 109a and 109c, either.

It is worth noting that the quantity of electric charge of the first buried well region 107 is about the same as the quantity of electric charge of the second buried well region 307. That is, the dopant concentration of the second buried well region 307 is higher than the dopant concentration of the first buried well region 107. As a result, the reversed breakdown voltage of the semiconductor device formed subsequently can be maintained at a higher level. Moreover, the configuration of the semiconductor substrate structure 300 is similar to that of the semiconductor substrate structure 100. The difference between the semiconductor substrate structure 100 and the semiconductor substrate structure 300 is that the second buried well region 307 is disposed in the semiconductor substrate structure 300, but not in the semiconductor substrate structure 100. Therefore, the semiconductor substrate structure 300 can better prevent the leakage current.

Figure 4:
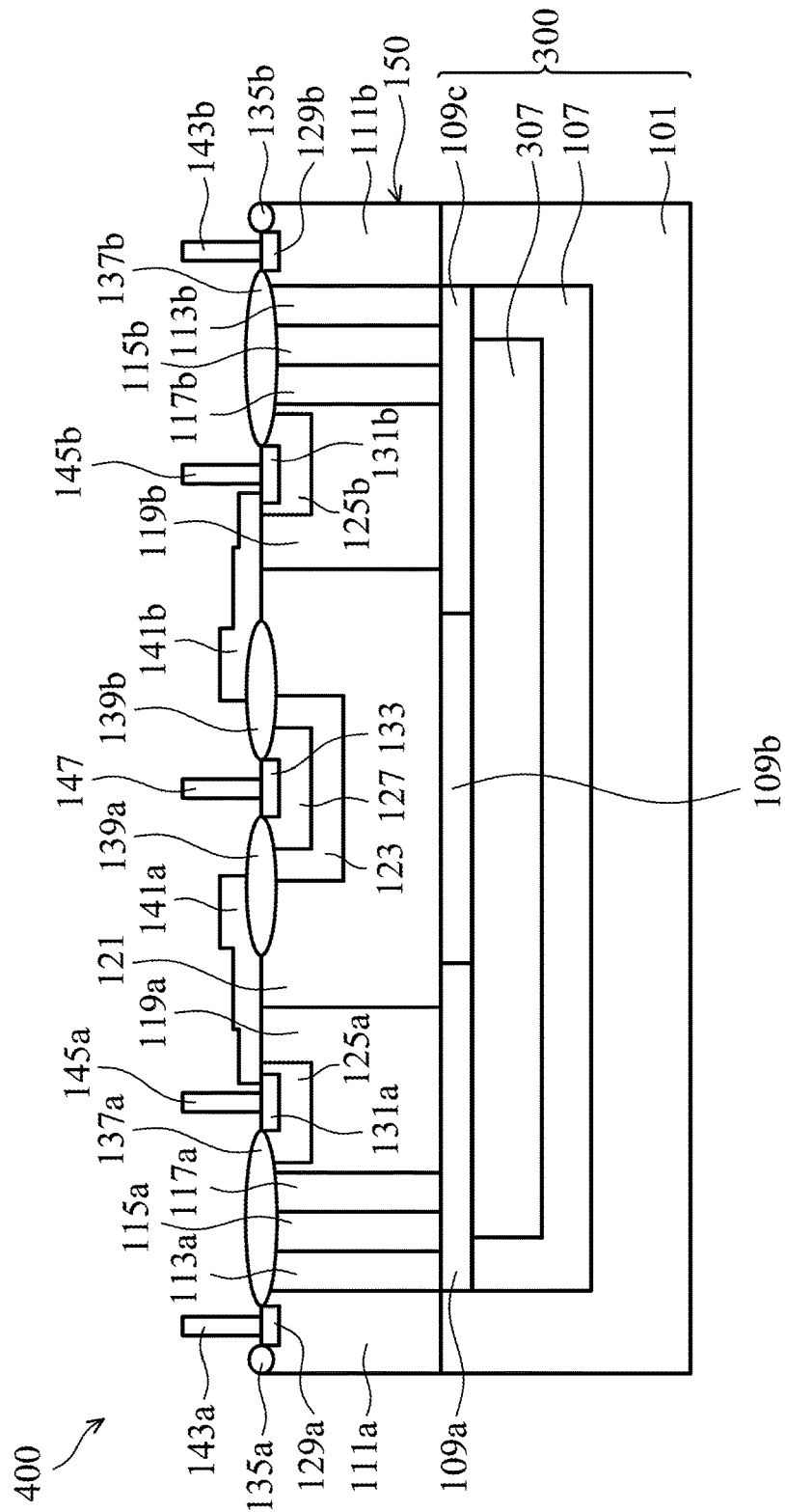
FIG. 4 is a cross-sectional view of a semiconductor device in accordance with some embodiments, wherein the semiconductor device of FIG. 4 includes the semiconductor substrate structure of FIG. 3C.

FIG. 4 is a cross-sectional view of a semiconductor device 400 in accordance with some embodiments, wherein the semiconductor device 400 of FIG. 4 includes the semiconductor substrate structure 300 of FIG. 3C.

The configuration of the semiconductor device 400 in FIG. 4 is similar to that of the semiconductor device 200 in FIG. 2. The difference between the semiconductor device 200 and the semiconductor device 400 is that the second buried well region 307 is disposed in the semiconductor device 400, but not in the semiconductor device 200. Therefore, the semiconductor device 400 can better prevent leakage current.

Figure 5B:
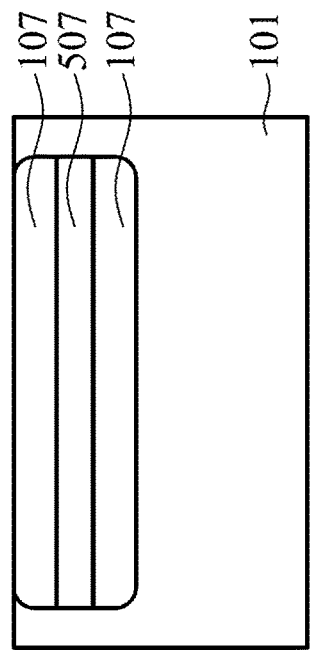
FIGS. 5A to 5C are cross-sectional views illustrating intermediate stages of a method for forming a semiconductor substrate structure in FIG. 5C in accordance with some embodiments.
Figure 5A:
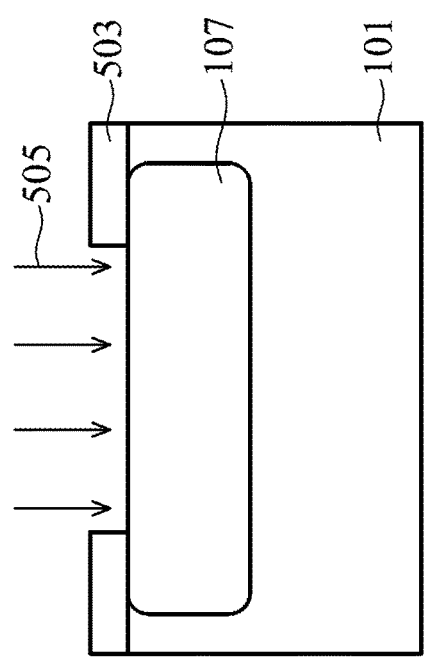
Figure 5C:
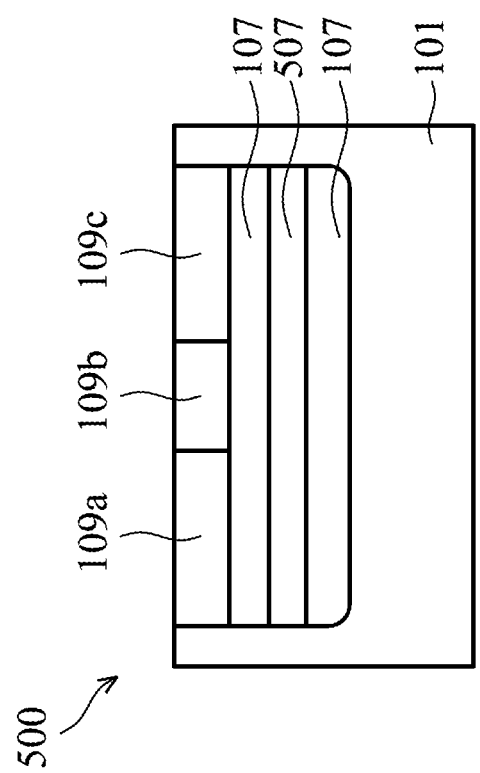

FIGS. 5A to 5C are cross-sectional views illustrating intermediate stages of a method for forming a semiconductor substrate structure 500 in FIG. 5C in accordance with some embodiments.

Continued from FIG. 1C, as shown in FIG. 5A, after the first buried well region 107 is formed, a patterned photo resist 503 is formed on the semiconductor substrate 101. A portion of the first buried well region 107 is exposed by the patterned photo resist 503, and an ion implantation process 505 is performed on the semiconductor substrate 101 by using the patterned photo resist 503 as the mask. In the embodiment, the ion implantation process 505 is performed to implant n-type dopants in the first buried well region 107, and the implantation dose is in a range from about $1\times10^{11}$ ions/cm$^2$ to about $1\times10^{13}$ ions/cm$^2$, and the implantation energy, which is in an range from about 1 MeV to about 3 MeV, is higher than those used to form other material layers.

Next, as shown in FIG. 5B, the patterned photo resist 503 is removed after performing the ion implantation process 505, and the ions implanted are driven into the first buried well region 107 to form a third buried well region 507. The top surface of the third buried well region 507 is lower than the top surface of the semiconductor substrate 101 and the top surface of the first buried well region 107, and the bottom surface of the third buried well region 507 is higher than the bottom surface of the first buried well region 107. In some embodiments, the dopants of the third buried well region 507 are accumulated in a depth range from about 1 µm to about 3 µm.

In addition, the conductivity type of the third buried well region 507 is the same as the conductivity type of the first buried well region 107. In the embodiment, the third buried well region 507 is n-type, and the dopant concentration of the third buried well region 507 is higher than the dopant concentration of the first buried well region 107.

As shown in FIG. 5C, in accordance with some embodiments, the first portion of the first buried layer 109a, the second buried layer 109b and the second portion of the first buried layer 109c are formed in the semiconductor substrate 101 by ion implantation processes so that the semiconductor substrate structure 500 is completed. Some processes used to form the first portion of the first buried layer 109a, the second buried layer 109b and the second portion of the first buried layer 109c in FIG. 5C are similar to, or the same as, those used to form the first portion of the first buried layer 109a, the second buried layer 109b and the second portion of the first buried layer 109c in FIG. 1D, respectively, so the descriptions thereof are not repeated herein. In some embodiments, the sidewalls of the third buried well region 507 are aligned with the sidewalls of the first buried well region 107, and aligned with the sidewalls of the first portion and the second portion of the first buried layer 109a and 109c, too. Moreover, the third buried well region 507 is separated from the first portion of the first buried layer 109a, the second buried layer 109b and the second portion of the first buried layer 109c by a portion of the first buried well region 107.

Figure 6:
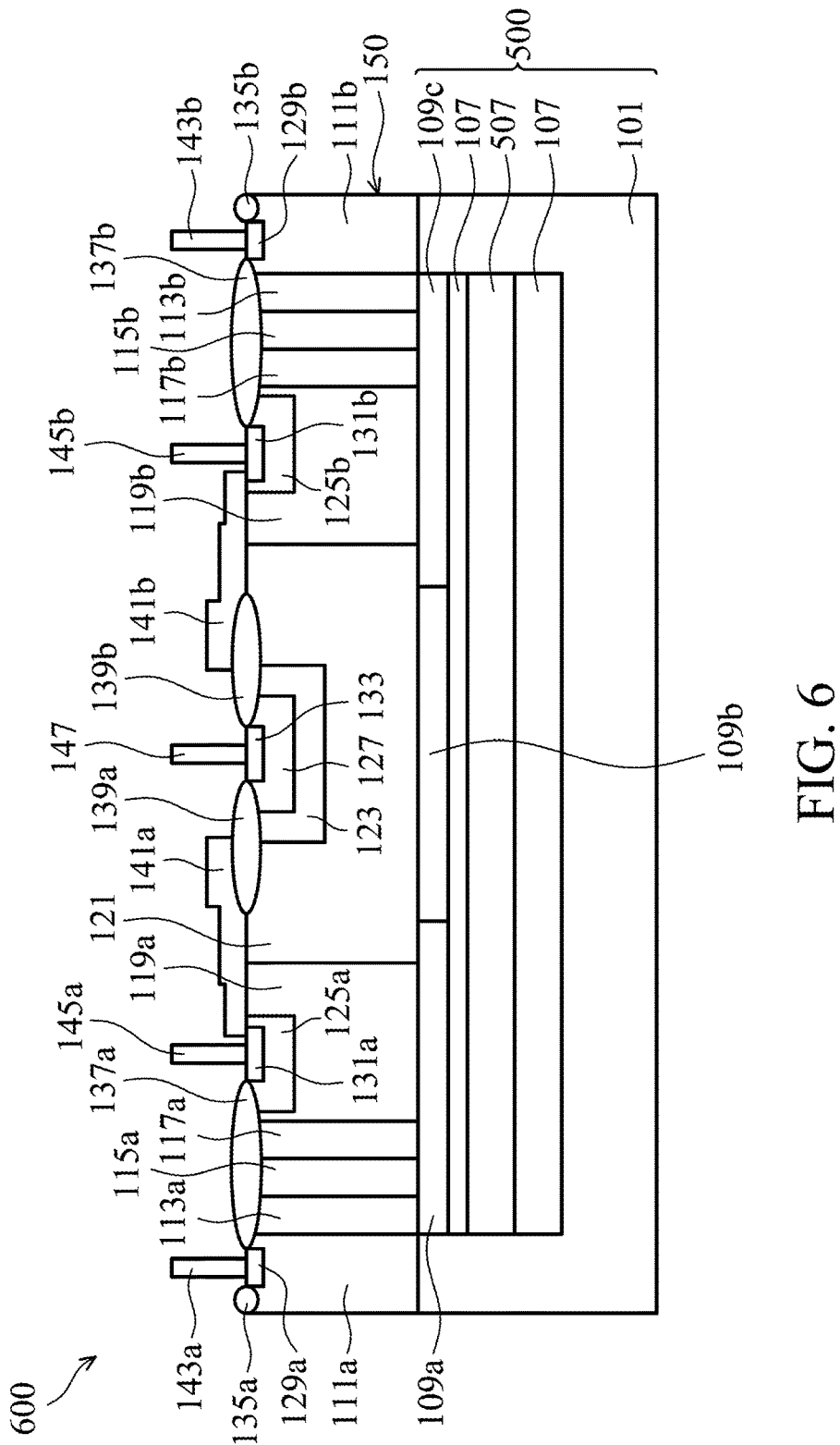
FIG. 6 is a cross-sectional view of a semiconductor device in accordance with some embodiments, wherein the semiconductor device of FIG. 6 includes the semiconductor substrate structure of FIG. 5C.

FIG. 6 is a cross-sectional view of a semiconductor device 600 in accordance with some embodiments, wherein the semiconductor device 600 of FIG. 6 includes the semiconductor substrate structure 500 of FIG. 5C.

The configuration of the semiconductor device 600 in FIG. 6 is similar to that of the semiconductor device 200 in FIG. 2. The difference between the semiconductor device 200 and the semiconductor device 600 is that the third buried well region 507 is disposed in the semiconductor device 600, but not in the semiconductor device 200. Therefore, the semiconductor device 600 can better prevent the leakage current.

Figure 7A:
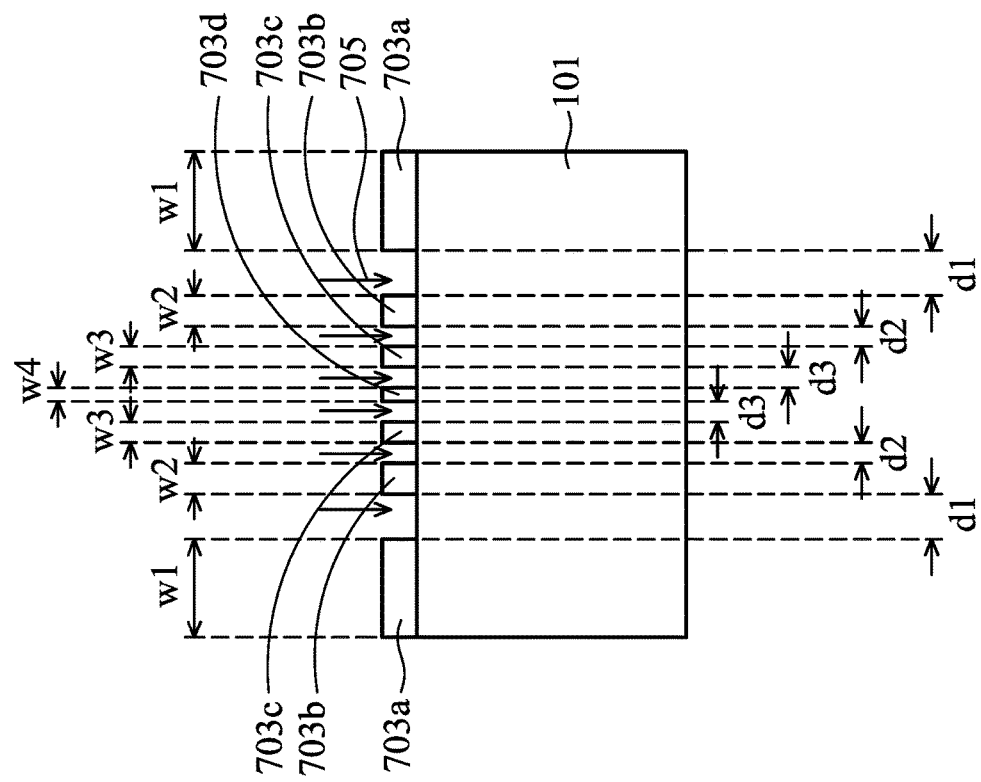
FIGS. 7A to 7C are cross-sectional views illustrating intermediate stages of a method for forming a semiconductor substrate structure in FIG. 7C in accordance with some embodiments.
Figure 7C:
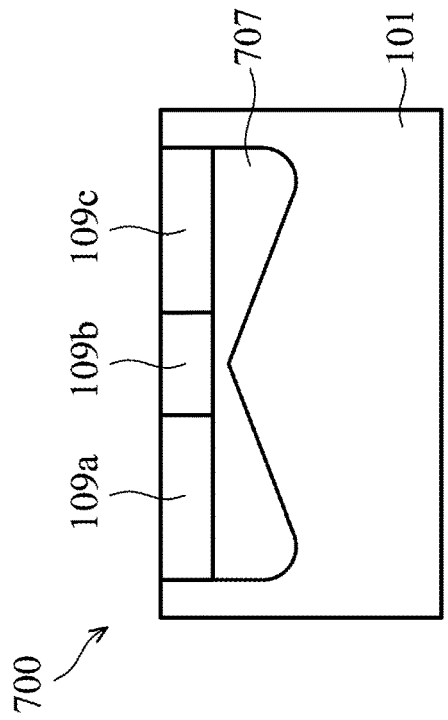
Figure 7B:
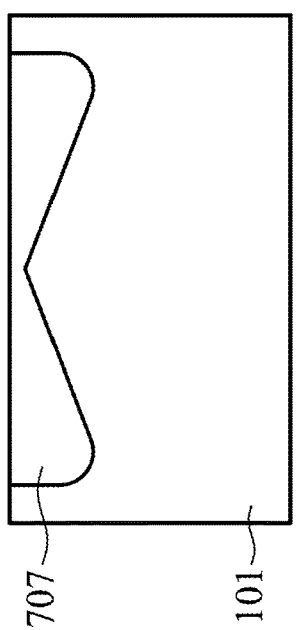

FIGS. 7A to 7C are cross-sectional views illustrating intermediate stages of a method for forming a semiconductor substrate structure 700 in FIG. 7C in accordance with some embodiments.

As shown in FIG. 7A, in accordance with some embodiments, a first portion of the patterned photo resist 703a, a second portion of the patterned photo resist 703b, a third portion of the patterned photo resist 703c and a fourth portion of the patterned photo resist 703d are formed on the semiconductor substrate 101. The arrangement of the first portion of the patterned photo resist 703a, the second portion of the patterned photo resist 703b, the third portion of the patterned photo resist 703c and the fourth portion of the patterned photo resist 703d are bilaterally symmetrical about the central line of the fourth portion of the patterned photo resist 703d, which is the axis of symmetry.

Moreover, the first portion of the patterned photo resist 703a has a width w1, the second portion of the patterned photo resist 703b has a width w2, the third portion of the patterned photo resist 703c has a width w3, and the fourth portion of the patterned photo resist 703d has a width w4. In the embodiment, the width w1 is greater than the width w2, the width w2 is greater than the width w3, and the width w3 is greater than the width w4.

Furthermore, a distance d1 is located between the first portion of the patterned photo resist 703a and the second portion of the patterned photo resist 703b, a distance d2 is located between the second portion of the patterned photo resist 703b and the third portion of the patterned photo resist 703c, and a distance d3 is located between the third portion of the patterned photo resist 703c and the fourth portion of the patterned photo resist 703d. In the embodiment, the distance d1 is greater than the distance d2, and the distance d2 is greater than the distance d3.

Still referring to FIG. 7A, an ion implantation process 705 is performed on the semiconductor substrate 101 by using the first portion, the second portion, the third portion and the fourth portion of the patterned photo resist 703a, 703b, 703c and 703d as the mask. In the embodiment, the ion implantation process 705 is performed to implant n-type dopants in the semiconductor substrate 101, and the implantation dose is in a range from about $5 \times 10^{11}$ ions/cm$^2$ to about $5 \times 10^{13}$ ions/cm$^2$.

Next, as shown in FIG. 7B, the first portion, the second portion, the third portion and the fourth portion of the patterned photo resist 703a, 703b, 703c and 703d are removed after performing the ion implantation process 705, and the ions implanted are driven into the semiconductor substrate 101 to form a linear first buried well region 707. The top surface of the first buried well region 707 is level with the top surface of the semiconductor substrate 101, and the bottom surface of the first buried well region 707 is located in the semiconductor substrate 101. In the embodiment, the first buried well region 707 is n-type.

Then, as shown in FIG. 7C, the first portion of the first buried layer 109a, the second buried layer 109b and the second portion of the first buried layer 109c are formed in the semiconductor substrate 101 by ion implantation processes so that the semiconductor substrate structure 700 is completed. Some processes used to form the first portion of the first buried layer 109a, the second buried layer 109b and the second portion of the first buried layer 109c in FIG. 7C are similar to, or the same as, those used to form the first portion of the first buried layer 109a, the second buried layer 109b and the second portion of the first buried layer 109c in FIG. 1D, respectively, so the descriptions thereof are not repeated herein. In some embodiments, the sidewalls of the first buried well region 707 are aligned with the sidewalls of the first portion and the second portion of the first buried layer 109a and 109c. Moreover, the dopant concentrations of the first portion of the first buried layer 109a, the second buried layer 109b and the second portion of the first buried layer 109c are higher than the dopant concentration of the first buried well region 707.

It is worth noting that the thickness of the first buried well region 707 is linearly and gradually decreased from the edges of the semiconductor substrate structure 700 to the central line of the semiconductor substrate structure 700. In other words, the thickness of the first buried well region 707 decreases gradually from the first portion of the first buried layer 109a to the second buried layer 109b, and the thickness of the first buried well region 707 is also gradually decreased from the second portion of the first buried layer 109c to the second buried layer 109b. The cross section of the first buried well region 707 is bilaterally symmetrical about the central line of the second buried layer 109b which is the axis of symmetry.

Figure 8:
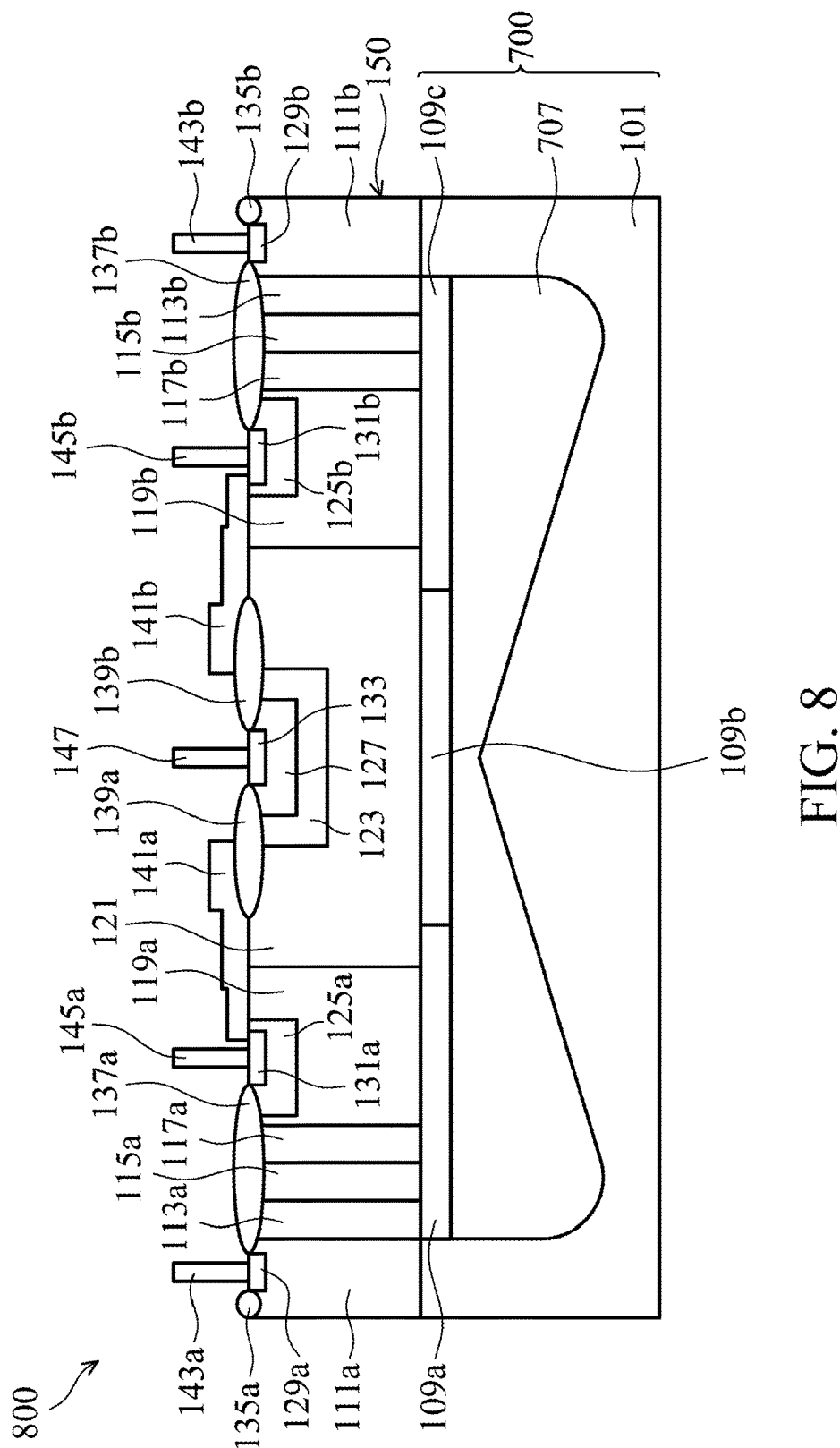
FIG. 8 is a cross-sectional view of a semiconductor device in accordance with some embodiments, wherein the semiconductor device of FIG. 8 includes the semiconductor substrate structure of FIG. 7C.

FIG. 8 is a cross-sectional view of a semiconductor device 800 in accordance with some embodiments, wherein the semiconductor device 800 of FIG. 8 includes the semiconductor substrate structure 700 of FIG. 7C.

The configuration of the semiconductor device 800 in FIG. 8 is similar to that of the semiconductor device 200 in FIG. 2. The difference between the semiconductor device 200 and the semiconductor device 800 is that the cross section of the first buried well region 707 of the semiconductor device 800 is bilaterally symmetrical about the central line of the second buried layer 109b, the third well region 121 and the third electrode 147, which is the axis of symmetry.

In the present disclosure, by disposing heavily doped buried layers and buried well regions, which have opposite conductivity types and wider ranges, in the semiconductor substrate, multiple PN junctions (such as PNPNP) may exist between the epitaxial layer on the semiconductor substrate and the semiconductor substrate. Therefore, leakage current can be prevented from flowing into the semiconductor substrate in the vertical direction. In addition, multiple well regions are disposed in the epitaxial layer, and these well regions are arranged in such a way that they are staggered in the horizontal direction according to their conductivity types, such that multiple PN junctions (such as PNPNP) can be produced. As a result, leakage current can be prevented from occurring in the horizontal direction.

Moreover, in the semiconductor substrate structure of the present disclosure, the dopant concentration of the buried layer is higher than the dopant concentration of the buried well region, and the bottom surface of the buried layer is higher than the bottom surface of the buried well region. Therefore, when a reversed bias voltage is applied to the semiconductor device, the reversed breakdown voltage of the semiconductor device can be maintained at a higher level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor substrate structure, comprising:
a semiconductor substrate having a first conductivity type;
a first buried well region disposed in the semiconductor substrate, wherein the first buried well region has a second conductivity type that is opposite to the first conductivity type;
a first buried layer and a second buried layer disposed in the semiconductor substrate and on the first buried well region, wherein the first buried layer has the second conductivity type, the second buried layer has the first conductivity type, the first buried layer has a first portion and a second portion, and the second buried layer is located between the first portion and the second portion; and a second buried well region disposed in the first buried well region and having the first conductivity type, wherein the second buried well region is surrounded by the first buried well region, and the second buried well region is in direct contact with the first buried layer and the second buried layer;

wherein a top surface of the first portion of the first buried layer, a top surface of the second buried layer, and a top surface of the second portion of the first buried layer are level with a top surface of the semiconductor substrate, a sidewall of the first portion of the first buried layer is aligned with a sidewall of the first buried well region, and a sidewall of the second portion of the first buried layer is aligned with another sidewall of the first buried well region.

2. The semiconductor substrate structure as claimed in claim 1, wherein the first buried layer has a dopant concentration that is higher than that of the first buried well region.

3. The semiconductor substrate structure as claimed in claim 1, wherein a dopant concentration of the first buried layer is higher than a dopant concentration of the second buried well region, and the dopant concentration of the second buried well region is higher than a dopant concentration of the first buried well region.

4. The semiconductor substrate structure as claimed in claim 1, wherein the first buried well region is adjacent to the first buried layer and the second buried layer, and a thickness of the first buried well region decreases gradually in a direction from the first buried layer to the second buried layer, and wherein a cross section of the first buried well region is bilaterally symmetrical about a central line of the second buried layer which is an axis of symmetry.

5. A semiconductor device, comprising:
a semiconductor substrate having a first conductivity type;
a first buried well region disposed in the semiconductor substrate, wherein the first buried well region has a second conductivity type that is opposite to the first conductivity type;
a first buried layer and a second buried layer disposed in the semiconductor substrate and on the first buried well region, wherein the first buried layer has the second conductivity type, the second buried layer has the first conductivity type, and the first buried layer has a first portion and a second portion, the second buried layer is located between the first portion and the second portion;
an epitaxial layer disposed on the semiconductor substrate, wherein the epitaxial layer comprises a first well region, a second well region and a third well region, the first well region and the second well region have the first conductivity type, the third well region has the second conductivity type, and the second well region is located between the first well region and the third well region; and
a first electrode, a second electrode and a third electrode disposed on the epitaxial layer, wherein the first electrode is electrically connected to the first well region, the second electrode is electrically connected to the second well region, and the third electrode is electrically connected to the third well region;

wherein a top surface of the first portion of the first buried layer, a top surface of the second buried layer, and a top surface of the second portion of the first buried layer are level with a top surface of the semiconductor substrate, a sidewall of the first portion of the first buried layer is aligned with a sidewall of the first buried well region, and a sidewall of the second portion of the first buried layer is aligned with another sidewall of the first buried well region.

6. The semiconductor device as claimed in claim 5, wherein the first buried layer, the second buried layer and the first buried well region are not covered by the first well region.

7. The semiconductor device as claimed in claim 5, wherein the third well region is adjacent to the second well region, the first buried layer and the second buried layer.

8. The semiconductor device as claimed in claim 5, further comprising:
a gate disposed between the second electrode and the third electrode, and a portion of the second well region and a portion of the third well region are covered by the gate.

9. The semiconductor device as claimed in claim 5, wherein each of the first well region, the second well region, the first electrode and the second electrode has a first portion and a second portion, and the first portions and the second portions of the first well region, the second well region, the first electrode and the second electrode are disposed symmetrically on both sides of the third electrode and the third well region.

10. The semiconductor device as claimed in claim 5, wherein a top surface of the semiconductor substrate is level with a top surface of the first buried layer and a top surface of the second buried layer, and a sidewall of the first buried layer is aligned with a sidewall of the first buried well region.

11. The semiconductor device as claimed in claim 5, further comprising:
a second buried well region disposed in the first buried well region and having the first conductivity type, wherein the second buried well region is surrounded by the first buried well region, and the second buried well region is in direct contact with the first buried layer and the second buried layer.

12. The semiconductor device as claimed in claim 5, further comprising:
a third buried well region disposed in the first buried well region and having the second conductivity type, wherein the third buried well region is separated from the first buried layer and the second buried layer by a portion of the first buried well region.

13. The semiconductor device as claimed in claim 5, wherein the first buried well region is adjacent to the first buried layer and the second buried layer, and a thickness of the first buried well region decreases gradually in a direction from the first buried layer to the second buried layer, and wherein a cross section of the first buried well region is bilaterally symmetrical about a central line of the second buried layer which is an axis of symmetry.

14. The semiconductor device as claimed in claim 5, further comprising:
a fourth well region, a fifth well region and a sixth well region disposed between the first well region and the second well region, wherein the fourth well region and the sixth well region have the second conductivity type, the fifth well region has the first conductivity type, and the fifth well region is sandwiched between the fourth well region and the sixth well region.

15. The semiconductor device as claimed in claim 14, wherein the second well region, the fourth well region, the fifth well region and the sixth well region are adjacent to the first buried layer.

16. The semiconductor device as claimed in claim 14, further comprising: an isolation structure disposed in the epitaxial layer, and the fourth well region, the fifth well region and the sixth well region are covered by the isolation structure.

* * * * *